(12) United States Patent
Soller

(10) Patent No.: US 9,698,086 B2
(45) Date of Patent: Jul. 4, 2017

(54) CHIP PACKAGE AND METHOD OF MANUFACTURING THE SAME

(71) Applicant: Infineon Technologies AG, Neubiberg (DE)

(72) Inventor: Tyrone Jon Donato Soller, Melaka (MY)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/306,243

(22) Filed: Jun. 17, 2014

(65) Prior Publication Data

US 2014/0291823 A1 Oct. 2, 2014

Related U.S. Application Data

(63) Continuation of application No. 13/541,789, filed on Jul. 5, 2012, now Pat. No. 8,759,956.

(51) Int. Cl.
*H01L 23/495* (2006.01)
*H01L 25/00* (2006.01)
(Continued)

(52) U.S. Cl.
CPC .... *H01L 23/49568* (2013.01); *H01L 23/4334* (2013.01); *H01L 23/49575* (2013.01); *H01L 24/49* (2013.01); *H01L 25/50* (2013.01); *H01L 23/3107* (2013.01); *H01L 24/40* (2013.01); *H01L 24/45* (2013.01); *H01L 2224/16245* (2013.01); *H01L 2224/32145* (2013.01); *H01L 2224/32245* (2013.01); *H01L 2224/40245* (2013.01); *H01L 2224/40247* (2013.01); *H01L 2224/45124* (2013.01); *H01L 2224/45139* (2013.01); *H01L 2224/45144* (2013.01); *H01L 2224/45147* (2013.01); *H01L 2224/45565* (2013.01); *H01L 2224/4848* (2013.01); *H01L 2224/48091* (2013.01); *H01L 2224/48105* (2013.01); *H01L 2224/48247* (2013.01); *H01L 2224/48465* (2013.01); *H01L 2224/49113* (2013.01); *H01L 2224/73221* (2013.01); *H01L 2224/73253* (2013.01); *H01L 2224/85207* (2013.01); *H01L 2224/85214* (2013.01);
(Continued)

(58) Field of Classification Search
None
See application file for complete search history.

(56) References Cited

U.S. PATENT DOCUMENTS 6,316,822 B1 11/2001 Venkateshwaran et al.
6,590,281 B2 7/2003 Wu et al.
(Continued)

FOREIGN PATENT DOCUMENTS

CN 101359661 A 2/2009
DE 112008001657 T5 6/2010
WO 2009017999 A2 2/2009

*Primary Examiner* — Hoang-Quan Ho
(74) *Attorney, Agent, or Firm* — Viering, Jentschura & Partner mbB

(57) ABSTRACT

Embodiments provide provides a chip package. The chip package may include a leadframe having a die pad and a plurality of lead fingers; a first chip attached to the die pad, the first chip being bonded to one or more of the lead fingers via a first set of wire bonds; a second chip bonded to one or more of the lead fingers via flip chip; and a heat slug attached to the second chip.

20 Claims, 6 Drawing Sheets

(51) Int. Cl.
  *H01L 23/36*  (2006.01)
  *H01L 23/433* (2006.01)
  *H01L 23/31*  (2006.01)
  *H01L 23/00*  (2006.01)

(52) U.S. Cl.
  CPC ........... *H01L 2224/85801* (2013.01); *H01L 2224/92247* (2013.01); *H01L 2924/014* (2013.01); *H01L 2924/12032* (2013.01); *H01L 2924/12042* (2013.01); *H01L 2924/1301* (2013.01); *H01L 2924/1305* (2013.01); *H01L 2924/1306* (2013.01); *H01L 2924/13034* (2013.01); *H01L 2924/13091* (2013.01); *H01L 2924/181* (2013.01)

(56) References Cited

U.S. PATENT DOCUMENTS

| | | | |
|---|---|---|---|
| 7,825,508 B2 | 11/2010 | Hebert et al. | |
| 2001/0010394 A1 | 8/2001 | Hisano et al. | |
| 2003/0214048 A1* | 11/2003 | Wu et al. | 257/777 |
| 2005/0161706 A1* | 7/2005 | Sutardja | 257/211 |
| 2006/0091516 A1 | 5/2006 | Matsunami | |
| 2006/0180904 A1* | 8/2006 | Ong | 257/676 |
| 2008/0024102 A1 | 1/2008 | Hebert et al. | |
| 2009/0152694 A1* | 6/2009 | Bemmerl et al. | 257/670 |

* cited by examiner

CHIP PACKAGE AND METHOD OF MANUFACTURING THE SAME

CROSS-REFERENCE(S) TO RELATED APPLICATION(S)

This application is a continuation of and claims priority to U.S. application Ser. No. 13/541,789, filed on Jul. 5, 2012, the contents of which are herein incorporated by reference in their entirety.

TECHNICAL FIELD

Embodiments relate generally to chip packages and a method of manufacturing a chip package.

BACKGROUND

A typical chip package includes a chip attached to a die pad of a leadframe and wire bonded to corresponding lead fingers of the leadframe for electrical connection with external circuitry. The die pad, the chip and the wire bonding are encapsulated with molding compound to form the chip package, which provides protection for the chip and provides electrical connection to the chip via the lead fingers extending from the package.

Such a chip package may provide limited function offered by the single chip. For a desired application which requires more complicated functions, several chip packages may be needed to provide more functions. Alternatively, a chip package incorporating more than one chip but having a bigger package dimension is needed to provide more functions required by a desired application.

It is desired to miniaturize a chip package while at the same time to provide more functions in a chip package.

SUMMARY

An embodiment provides a chip package. The chip package may include a leadframe having a die pad and a plurality of lead fingers; a first chip attached to the die pad, the first chip being bonded to one or more of the lead fingers via a first set of wire bonds; a second chip bonded to one or more of the lead fingers via flip chip; and a heat slug attached to the second chip.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Figure 1:
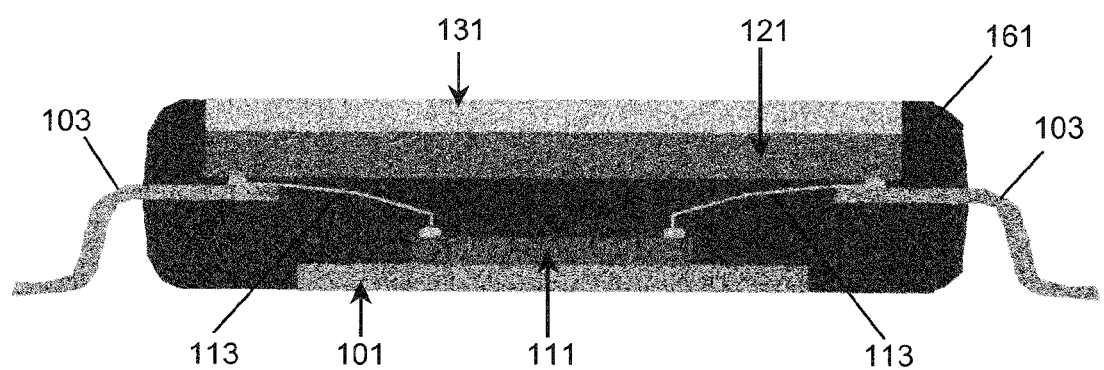
FIG. 1 shows a chip package according to an embodiment.

Various embodiments provide a chip package which enables more device functionality in a single compact package having a given package area or volume.

Embodiments described below in context of the chip packages are analogously valid for the respective method of forming the chip package, and vice versa.

In various embodiments, at least one of a plurality of chips may include at least part of a wafer substrate. Alternatively, each of plurality of chips may include at least part of a wafer substrate. At least one of plurality of chips may include one or more electronic circuits formed within the wafer substrate, e.g. which may have already been formed through an earlier front end process. At least one of plurality of chips may include at least part of a power semiconductor chip, wherein the power semiconductor chip may include at least one power semiconductor device from the group consisting of: a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, a gallium nitride device.

It may be understood that the plurality of chips may not be limited to power semiconductor devices, but may also include logic devices, e.g. an application specific integrated chip ASIC or a programmable processor such as e.g. a programmable microprocessor, e.g. a driver, e.g. a controller, e.g. a sensor, and/or memory devices such as random access memory devices including volatile and/or non-volatile memory devices.

One embodiment is directed to a chip package. The chip package may include a leadframe having a die pad and a plurality of lead fingers; a first chip attached to the die pad, the first chip being bonded to one or more of the lead fingers via a first set of wire bonds; a second chip bonded to one or more of the lead fingers via flip chip; and a heat slug attached to the second chip.

In various embodiments, the leadframe is a substrate on which the chip is mounted and packaged, and may include metal, e.g. copper or other suitable material, such as a copper alloy or a ferrous alloy, providing electrical connection and mechanical support for the chip.

In an embodiment, the leadframe may include a plurality of die pads and corresponding lead fingers, wherein the die pads are spaced from each other. A plurality of chip packages may be formed on the plurality of die pads during the packaging process, and may be finally separated to form individual chip packages. For simplicity, the following description is made with regard to a chip package formed on a die pad of the leadframe, but it is understood that a plurality of chip packages may be formed similarly on a plurality of die pads of the leadframe according to various embodiments.

In an embodiment, an active surface of the second chip may face an active surface of the first chip.

In an embodiment, the heat slug attached to the second chip enables heat dissipation from the top of the chip package, thereby providing a good thermal cooling performance for the chip package. The chip package formed thereby may be referred to as a dual cool chip (DCC) package.

In an embodiment, the chip package may further include a third chip attached on the first chip, wherein the third chip is bonded to one or more of the lead fingers of the lead frame via a second set of wire bonds. The active surface of the third chip faces the active surface of the second chip.

In a further embodiment, the chip package may further include a fourth chip attached on the die pad. The fourth chip may be arranged next to the first chip, and may be spaced from the first chip. In an embodiment, the fourth chip is bonded to one or more lead fingers via a third set of wire bonds.

In an embodiment, the chip package may further include a clip attached on the fourth chip. According to an embodiment, the clip is arranged such that one end of the clip is attached on the fourth chip and the other end of the clip is attached on one or more lead fingers. In an embodiment, the clip may have a hook shape. In other embodiments, the clip may have other suitable shapes to be fit between the fourth chip and the corresponding lead fingers of the leadframe.

The clip may include a plurality of contact points for a plurality of chip leads of the fourth chip, so as to provide a connection to a plurality of chip leads of the fourth chip.

In an embodiment, the clip may be attached on the fourth chip using non-conductive die attach material, e.g. in a glue process, a die attach process or a wafer back coating process. In another embodiment, the clip may be attached to the fourth chip using conductive die attach material (such as solder paste, glue or epoxy) in a die attach process or a wafer back coating process. In a further embodiment, the clip may be attached to the fourth chip using solder wire in a soft solder process. In other embodiments, the clip may be attached using other suitable adhesive in other suitable process.

According to an embodiment, the chip package may further include an encapsulation layer encapsulating the die pad, the first chip, the second chip, and the first set of wire bonds. In an embodiment, the encapsulation layer may also encapsulate the third chip, the fourth chip, the second set of wire bonds and the third set of wire bonds, so as to form an entire chip package.

According to an embodiment, the encapsulation layer may include an encapsulation material. The encapsulation material may include at least one from the following group of materials, the group consisting of: filled or unfilled epoxy, pre-impregnated composite fibers, reinforced fibers, laminate, a mold material, a mold compound, a thermoset material, a thermoplastic material, filler particles, fiber-reinforced laminate, fiber-reinforced polymer laminate, fiber-reinforced polymer laminate with filler particles.

It is understood that the chip package may include more than four chips as described in the embodiments above. For example, there may be a few more chips attached on the die pads and spaced from each other. In another example, there may be a few more chips attached on top of the chips that are attached on the die pads. In a further example, there may be a few more flip chips bonded to the lead fingers via flip chip process and spaced from each other.

Another embodiment is directed to a method of manufacturing a chip package. The method may include attaching a first chip on a die pad of a leadframe, the leadframe including the die pad and a plurality of lead fingers; forming a first set of wire bonds for bonding the first chip to one or more of the lead fingers; bonding a second chip to one or more of the lead fingers via flip chip; and attaching a heat slug on the second chip.

In an embodiment, the first chip may be attached on the die pad via die bonding using printable pastes, glue or die attach films. In another embodiment, the first chip may be attached on the die pad using diffusion soldering. In an embodiment, the first chip may be attached to the die pad using non-conductive die attach material, e.g. in a glue process, a die attach process or a wafer back coating process. In another embodiment, the first chip may be attached to the die pad using conductive die attach material (such as solder paste, glue or epoxy) in a die attach process or a wafer back coating process. In a further embodiment, the first chip may be attached to the die pad using solder wire in a soft solder process. Other suitable die attach materials and processes may be used to attach the first chip on the die pad in other embodiments.

In an embodiment, the first set of wire bonds is formed in a wire bonding process, e.g. using ball stitch on ball (BSOB) bonding, such that the first chip is wire bonded to the one or more lead fingers. In another embodiment, forming the first set of wire bonds includes forming one or more security bonds on the lead fingers, such that the first chip may be wire bonded with the security bonds on the lead fingers via the first set of wire bonds. In other embodiments, the first set of wire bonds may be formed using other suitable wire bonding techniques, e.g. using solder bond, aluminum wire bond, gold wire bond, palladium coated gold wire bond, silver wire bond, or copper wire bond by thermosonic bonding or laser bonding.

According to an embodiment, the second chip is flipped over such that its active surface faces down towards an active surface of the first chip, and is bonded to the corresponding lead fingers in the flip chip process. In an embodiment, the second chip may be bonded on the BSOB or security bonds on the lead fingers.

In an embodiment, the heat slug is attached to the second chip using die attach films. In another embodiment, the heat slug is attached to the second chip using diffusion solder. In various embodiment, the heat slug may be attached to the second chip using non-conductive die attach material, or conductive die attach material (such as solder paste, glue or epoxy), or other suitable adhesive materials in a glue process or a die attach process or other suitable processes.

In an embodiment, the method may further include attaching a third chip on the first chip, before bonding the second chip via the flip chip process. In an embodiment, a second set of wire bonds may be formed to bond the third chip to one or more of the lead fingers of the lead frame. The active surface of the third chip may face the active surface of the second chip bonded thereafter.

According to an embodiment, the third chip may be attached via die bonding using printable pastes, glue or die attach films. In another embodiment, the third chip may be attached using diffusion soldering. In an embodiment, the third chip may be attached on the first chip using non-conductive die attach material, e.g. in a glue/epoxy process, a die attach process or a wafer back coating process. In another embodiment, the third chip may be attached to the first chip using conductive die attach material (such as solder paste, glue or epoxy) in a die attach process or a wafer back coating process. Other suitable die attach materials and processes may be used to attach the third chip in other embodiments.

In a further embodiment, the method may further include attaching a fourth chip on the die pad. The fourth chip may be arranged next to the first chip, and may be spaced from the first chip. The fourth chip may be attached on the die pad before attaching the third chip on the first chip. In an embodiment, a third set of wire bonds is formed to bond the fourth chip to one or more lead fingers.

According to an embodiment, the fourth chip may be attached via die bonding using printable pastes, glue or die attach films. In another embodiment, the third chip and the fourth chip may be attached using diffusion soldering. In an embodiment, the fourth chip may be attached to the die pad using non-conductive die attach material, e.g. in a glue process, a die attach process or a wafer back coating process. In another embodiment, the fourth chip may be attached to the die pad using conductive die attach material (such as solder paste, glue or epoxy) in a die attach process or a wafer back coating process. In a further embodiment, the fourth chip may be attached to the die pad using solder wire in a soft solder process. Other suitable die attach materials and processes may be used to attach the third chip and the fourth chip in other embodiments.

In an embodiment, forming the second set of wire bonds and the third set of wire bonds may use a wire bonding process, e.g. a ball stitch on ball (BSOB) bonding, so as to wire bond the third chip and the fourth chip to the respective lead fingers. In another embodiment, forming the second set of wire bonds and the third set of wire bonds includes forming one or more security bonds on the lead fingers, such that the third chip and the fourth chip may be wire bonded with the security bonds on the lead fingers via the second set of wire bonds and the third set of wire bonds. In other embodiments, other suitable wire bonding techniques may be used to form the second set of wire bonds and the third set of wire bonds, e.g. using solder bond, aluminum wire bond, gold wire bond, palladium coated gold wire bond, silver wire bond, or copper wire bond in thermosonic bonding or laser bonding.

According to an embodiment, the method may further include attaching a clip on the fourth chip, e.g. using solder paste or other suitable adhesive. The clip may be arranged such that one end of the clip is attached on the fourth chip and the other end of the clip is attached on one or more lead fingers. The clip may have a hook shape or other suitable shapes to be fit between the fourth chip and the corresponding lead fingers of the leadframe.

According to an embodiment, the method may further include depositing an encapsulation layer encapsulating the die pad, the first chip, the second chip, and the first set of wire bonds. In an embodiment, the encapsulation layer may be formed to also encapsulate the third chip, the fourth chip, the second set of wire bonds and the third set of wire bonds, so as to form an entire chip package.

It is understood that the method may attach more than four chips as described in the embodiments above. For example, the method may include attaching a few more chips attached on the die pads, attaching a few more chips on top of the chips that are attached on the die pads, and/or bonding a few more flip chips to the lead fingers via flip chip process according to various embodiments.

A further embodiment provides a chip package. The chip package may include a chip carrier including a chip contact structure; a first chip being bonded to the chip contact structure via wire bonds; and a second chip bonded to the chip contact structure via flip chip contacts.

In an embodiment, the chip package may further include a heat dissipation structure attached to the second chip.

A further embodiment provides a chip package. The chip package may include a chip carrier including a chip contact structure; a first chip being bonded to the chip contact structure via a first chip bonding technology structure; and a second chip being bonded to the chip contact structure via a second chip bonding technology structure. The second chip bonding technology structure is different from the first chip bonding technology structure.

In an embodiment, the chip package may further include a heat dissipation structure attached to the second chip.

In an embodiment, the first chip bonding technology structure may include a plurality of bond wires; and the second chip bonding technology structure may include a flip chip structure.

FIG. 1 shows a chip package according to an embodiment.

The chip package includes a leadframe on which one or more chips may be mounted and packaged. The leadframe may include metal, e.g. copper or other suitable material, such as a copper alloy or a ferrous alloy, providing electrical connection and mechanical support for the chip. Examples of the copper alloy may include an alloy including Cu, Cr, Sn, Zn; or an alloy including Cu, Ni, Si, Zn, Ag. As shown in FIG. 1, the leadframe may include a die pad 101 and a plurality of lead fingers 103.

The chip package may include a first chip 111 attached to the die pad 101, wherein the first chip 111 is bonded to the lead fingers 103 via a first set of wire bonds 113.

The chip package may further include a second chip 121, which is a flip chip bonded to the corresponding lead fingers 103. An active surface of the second chip 121 may face an active surface of the first chip 111.

A heat slug 131, in general a heat dissipation structure, may be attached to the second chip 121, so as to enable heat dissipation from the top of the chip package. In another embodiment, the heat slug 131 may be optional such that the chip package only includes the first chip 111 and the second chip 121 attached on the die pad 101 of the leadframe.

According to an embodiment, an encapsulation layer 161 may be formed to encapsulate the die pad 101, the first chip 111, the second chip 121, and the first set of wire bonds 113.

According to an embodiment, the encapsulation layer 161 may include an encapsulation material. The encapsulation material may include at least one from the following group of materials, the group consisting of: filled or unfilled epoxy, pre-impregnated composite fibers, reinforced fibers, laminate, a mold material, a mold compound, a thermoset material, a thermoplastic material, filler particles, fiber-reinforced laminate, fiber-reinforced polymer laminate, fiber-reinforced polymer laminate with filler particles.

It is understood that the chip package may include more than two chips as described in the embodiments of FIG. 1 above, and the other embodiments include more chips will be described below.

Figure 2:
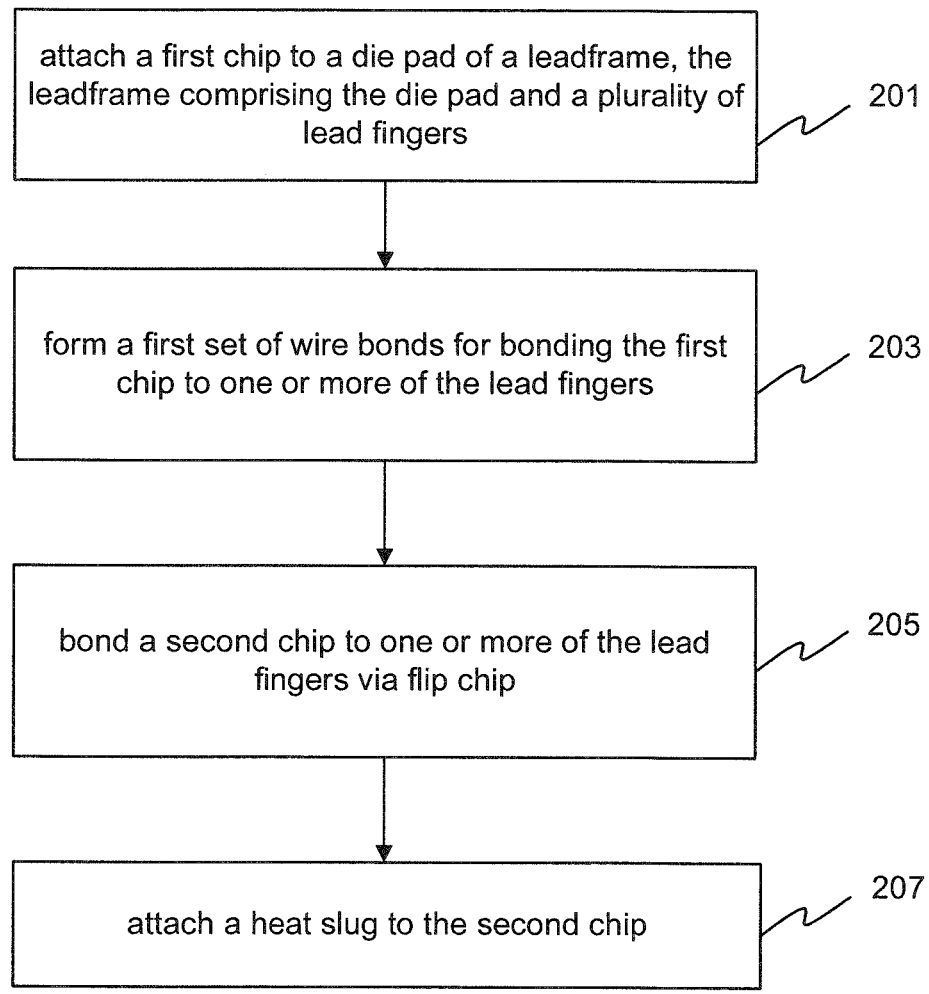
FIG. 2 shows a flowchart illustrating a method of forming a chip package according to an embodiment.

FIG. 2 shows a flowchart illustrating a method of manufacturing a chip package (e.g. the chip package of FIG. 1) according to an embodiment.

At 201, a first chip is attached to a die pad of a leadframe, wherein the leadframe includes the die pad and a plurality of lead fingers. In an embodiment, the first chip may be attached on the die pad via die bonding using printable pastes, glue or die attach films. In another embodiment, the first chip may be attached on the die pad using diffusion soldering. In an embodiment, the first chip may be attached to the die pad using non-conductive die attach material, e.g. in a glue process, a die attach process or a wafer back coating process. In another embodiment, the first chip may be attached to the die pad using conductive die attach material (such as solder paste, glue or epoxy) in a die attach process or a wafer back coating process. In a further embodiment, the first chip may be attached to the die pad using solder wire in a soft solder process. Other suitable die attach materials and processes may be used to attach the first chip on the die pad in other embodiments.

At 203, a first set of wire bonds are formed for bonding the first chip to one or more of the lead fingers. In an embodiment, the first set of wire bonds is formed in a wire bonding process, e.g. using ball stitch on ball (BSOB) bonding. In another embodiment, forming the first set of wire bonds may include forming one or more security bonds on the lead fingers, such that the first chip may be wire bonded with the security bonds on the lead fingers via the first set of wire bonds. In other embodiments, the first set of wire bonds may be formed using other suitable wire bonding techniques, e.g. using solder bond, aluminum wire bond, gold wire bond, palladium coated gold wire bond, silver wire bond, or copper wire bond by thermosonic bonding or laser bonding.

At 205, a second chip is bonded to one or more of the lead fingers via a flip chip process. In an embodiment, an active surface of the second chip may face an active surface of the first chip. In an embodiment, the second chip may be bonded on the BSOB or security bonds on the lead fingers.

At 207, a heat slug is attached to the second chip. In various embodiments, the heat slug may be attached on the second chip using die attach films or diffusion solder.

Figure 3:
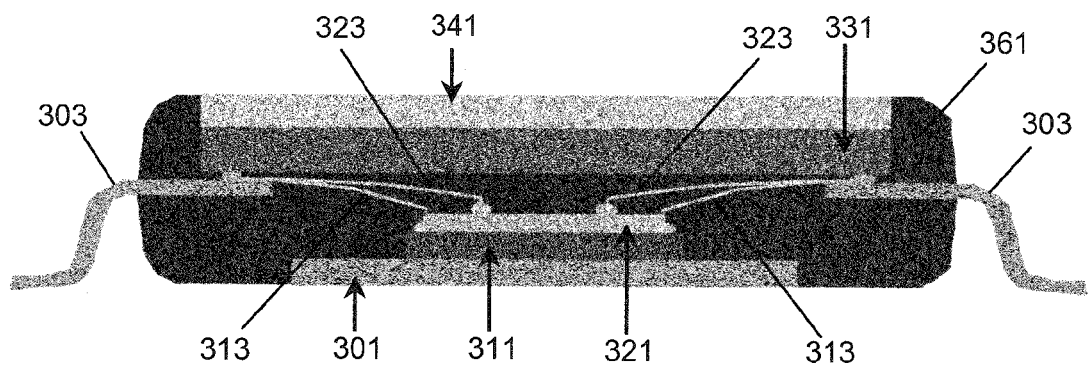
FIG. 3 shows a chip package according to another embodiment.

FIG. 3 shows a chip package according to another embodiment.

As shown in FIG. 3, the chip package may include a leadframe, which includes a die pad 301 and a plurality of lead fingers 303 for providing mechanical support and electrical connection for chips mounted thereon.

The chip package may include a first chip 311 attached on the die pad 301, wherein the first chip 311 is bonded to the lead fingers 303 via a first set of wire bonds 313.

In an embodiment, the chip package may further include a second chip 321 attached on the first chip 311, wherein the second chip 321 is bonded to one or more of the lead fingers 303 of the leadframe via a second set of wire bonds 323.

In a further embodiment, the chip package may further include a third chip 331, which is a flip chip bonded to the corresponding lead fingers 303. Since the third chip 331 is flipped over, an active surface of the third chip 331 faces an active surface of the second chip 321.

A heat slug 341 may be attached on the third chip 331, enabling heat dissipation from the top of the chip package.

According to an embodiment, an encapsulation layer 361 may be formed to encapsulate the die pad 301, the first chip 311, the second chip 321, the third chip 331, the first set of wire bonds 313 and the second set of wire bonds 323.

Figure 4:
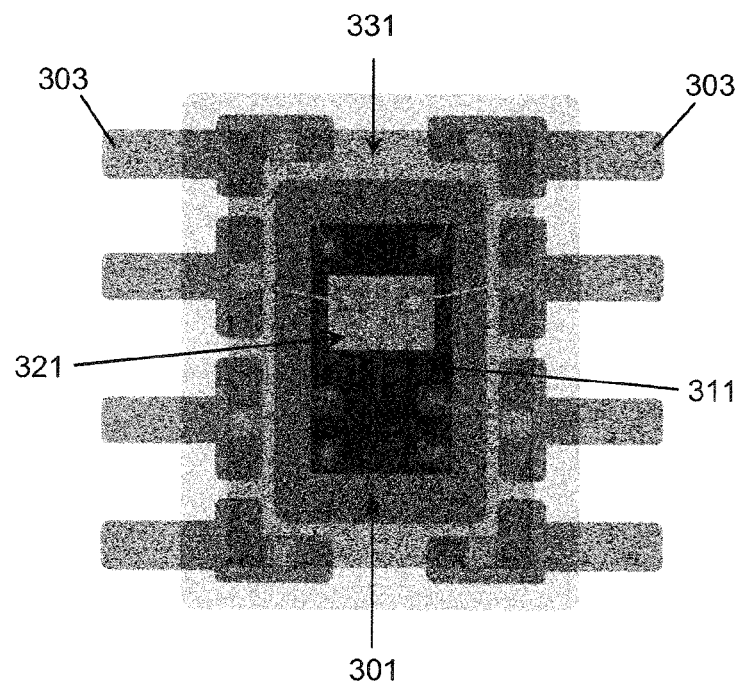
FIG. 4 shows a top view of a chip package of FIG. 3 according to an embodiment.

A top view of the chip package of FIG. 3 is shown in FIG. 4, which shows the first chip 311 attached on the die pad 301, the second chip 321 attached on the first chip 311, the third chip 331 bonded on top of the second chip 321, and the respective wire bonds connected from the respective chip to the respective lead fingers 303.

Figure 5:
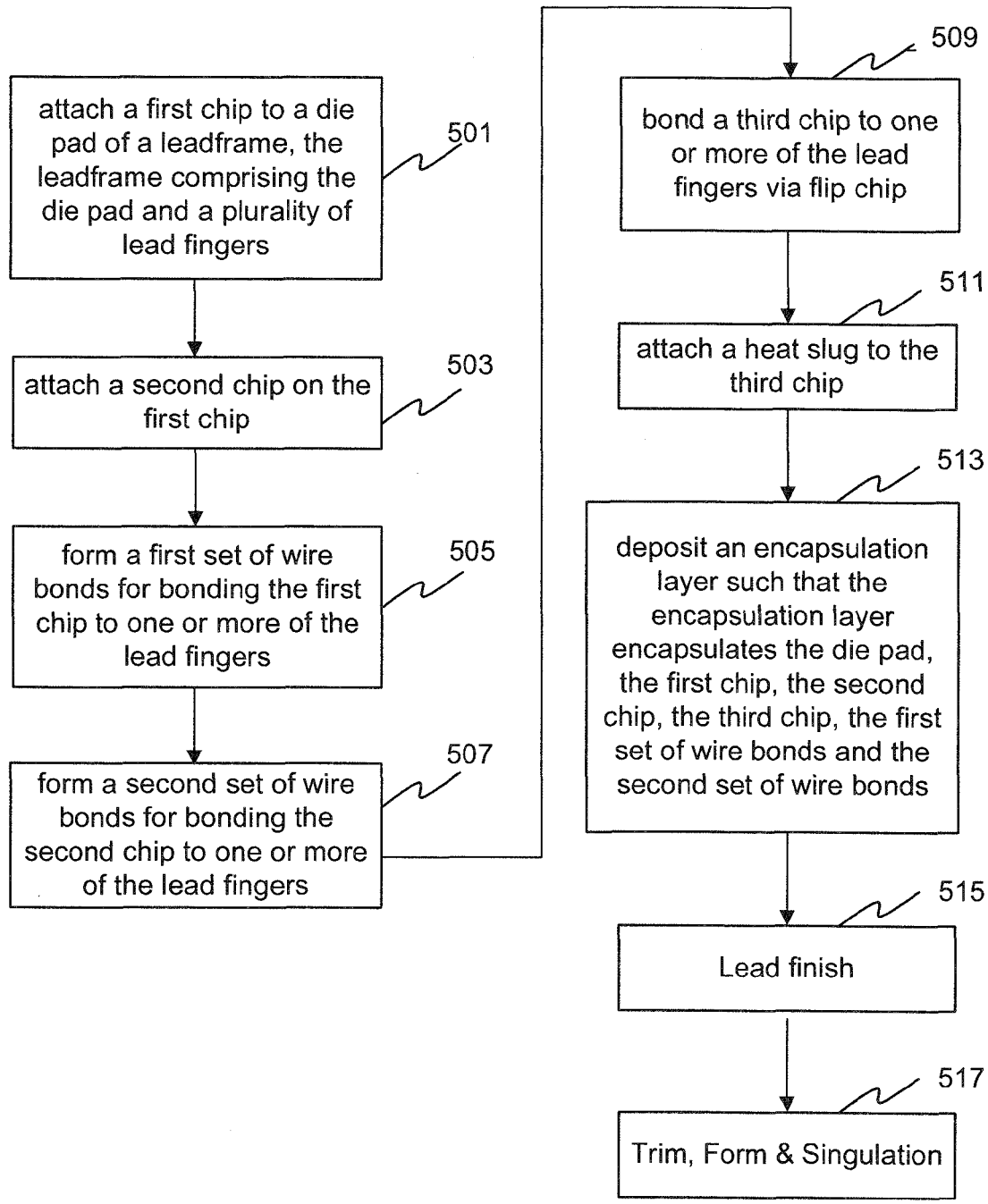
FIG. 5 shows a flowchart illustrating a method of forming a chip package according to another embodiment.

FIG. 5 shows a flowchart illustrating a method of manufacturing a chip package (e.g. the chip package of FIG. 3 and FIG. 4) according to another embodiment.

At 501, a first chip is attached to a die pad of a leadframe, wherein the leadframe includes the die pad and a plurality of lead fingers. In an embodiment, the first chip may be attached on the die pad via die bonding using printable pastes, glue or die attach films. In another embodiment, the first chip may be attached on the die pad using diffusion soldering. In an embodiment, the first chip may be attached to the die pad using non-conductive die attach material, e.g. in a glue process, a die attach process or a wafer back coating process. In another embodiment, the first chip may be attached to the die pad using conductive die attach material (such as solder paste, glue or epoxy) in a die attach process or a wafer back coating process. In a further embodiment, the first chip may be attached to the die pad using solder wire in a soft solder process. Other suitable die attach materials and processes may be used to attach the first chip on the die pad in other embodiments.

At 503, a second chip is attached on the first chip. The second chip may be attached via die bonding using printable pastes, glue or die attach films, or may be attached using diffusion soldering. In an embodiment, the second chip may be attached on the first chip using non-conductive die attach material, e.g. in a glue/epoxy process, a die attach process or a wafer back coating process. In another embodiment, the second chip may be attached to the first chip using conductive die attach material (such as solder paste, glue or epoxy) in a die attach process or a wafer back coating process. Other suitable die attach materials and processes may also be used to attach the second chip.

At 505, a first set of wire bonds are formed for bonding the first chip to one or more of the lead fingers.

At 507, a second set of wire bonds are formed for bonding the second chip to one or more of the lead fingers.

In an embodiment, the first set of wire bonds and the second set of wire bonds may be formed in a wire bonding process, e.g. using ball stitch on ball (BSOB) bonding. In another embodiment, forming the first set of wire bonds and the second set of wire bonds may include forming one or more security bonds on the lead fingers, such that the first chip and the second chip may be wire bonded with the respective security bonds on the respective lead fingers via the first set of wire bonds and the second set of wire bonds. Other suitable wire bonding techniques may also be used to form the first set of wire bonds and the second set of wire bonds, e.g. using solder bond, aluminum wire bond, gold wire bond, palladium coated gold wire bond, silver wire bond, or copper wire bond by thermosonic bonding or laser bonding.

At 509, a third chip is bonded to one or more of the lead fingers via a flip chip process. In an embodiment, an active surface of the third chip may face an active surface of the second chip. In various embodiments, the third chip may be bonded on the BSOB or security bonds on the lead fingers.

At 511, a heat slug is attached to the third chip. In various embodiments, the heat slug may be attached on the third chip using die attach films or diffusion solder.

At 513, according to an embodiment, an encapsulation layer may be deposited to encapsulate the die pad, the first chip, the second chip, the third chip, the first set of wire bonds and the second set of wire bonds. In an embodiment, the encapsulation layer may include an encapsulation material. The encapsulation material may include at least one from the following group of materials, the group consisting of: filled or unfilled epoxy, pre-impregnated composite fibers, reinforced fibers, laminate, a mold material, a mold compound, a thermoset material, a thermoplastic material, filler particles, fiber-reinforced laminate, fiber-reinforced polymer laminate, fiber-reinforced polymer laminate with filler particles.

In an embodiment, the encapsulation layer may be deposited by Glob Top, wherein encapsulation material is deposited on the die pad, the first chip, the second chip, the third chip, the first set of wire bonds and the second set of wire bonds, and is cured afterwards. In another embodiment, the encapsulation layer may be deposited by Dam-and-Fill, which utilizes a dam around the periphery of the leadframe. In other embodiments, the encapsulation layer may be deposited by compression molding, transfer molding, injection molding, or other suitable processes.

At 515, a lead finish may be carried out, e.g. using a coating process or a plating process.

At 517, a trim, form and singulation process may be carried out, so as to separate individual chip packages from the leadframe. The singulation process may include one or more of the processes sawing, etching, singulating by means of laser or by means of breaking.

Figure 6:
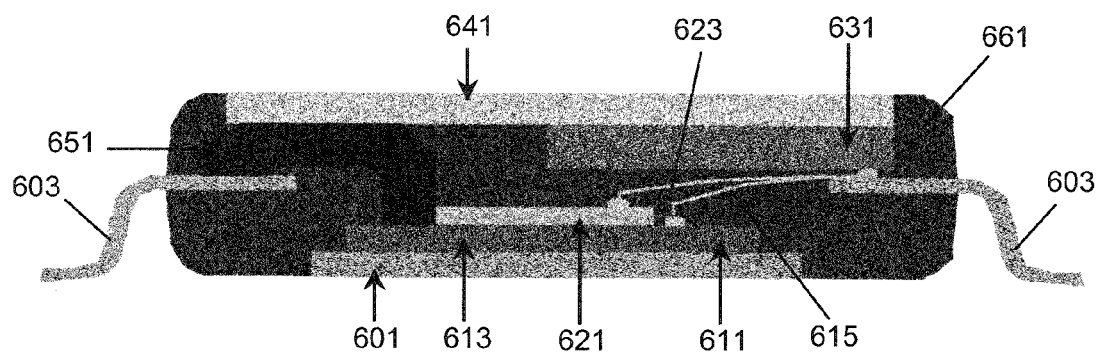
FIG. 6 shows a chip package according to a further embodiment.

FIG. 6 shows a chip package according to a further embodiment.

As shown in FIG. 6, the chip package may include a leadframe, which includes a die pad 601 and a plurality of lead fingers 603 for providing mechanical support and electrical connection for chips mounted thereon.

The chip package may include a first chip 611 attached on the die pad 601, wherein the first chip 611 is bonded to the lead fingers 603 via a first set of wire bonds 615.

The chip package may further include a second chip 613 attached on the die pad 601, wherein the second chip 613 is bonded to the lead fingers 603 via a second set of wire bonds (not shown in FIG. 6). It is noticed that the first chip 611 and the second chip 613 are shown as the same structure in the cross-sectional view of FIG. 6, but shown as two separate chips spaced from each other in a top view in FIG. 7. The second set of wire bonds for bonding the second chip 613 to the lead fingers 603 is also shown in the top view of FIG. 7.

In an embodiment, the chip package may further include a third chip 621 attached on the first chip 611, wherein the third chip 621 is bonded to one or more of the lead fingers 303 of the leadframe via a third set of wire bonds 623.

In an embodiment, a clip 651 may be attached on the second chip 613 using solder paste or other suitable adhesive. According to an embodiment, the clip 651 is arranged such that one end of the clip 651 is attached on the second chip 613 and the other end of the clip 651 is attached on one or more lead fingers 603. In an embodiment as shown in FIG. 6, the clip 651 may have a hook shape. In other embodiments, the clip may have other suitable shapes to be fit between the second chip 613 and the corresponding lead fingers of the leadframe. The clip 651 may include a plurality of contact points for a plurality of chip leads of the second chip 613, so as to provide a connection to a plurality of chip leads of the second chip 613.

In a further embodiment, the chip package may further include a fourth chip 631, which is a flip chip bonded to the corresponding lead fingers 603. Since the fourth chip 631 is flipped over, an active surface of the fourth chip 631 faces an active surface of the third chip 621.

A heat slug 641 may be attached on the fourth chip 631, enabling heat dissipation from the top of the chip package.

According to a further embodiment, an encapsulation layer 661 may be formed to encapsulate the die pad 601, the first chip 611, the second chip 613, the third chip 621, the fourth chip 631, the first set of wire bonds 315, the second set of wire bonds and the third set of wire bonds 623.

Figure 7:
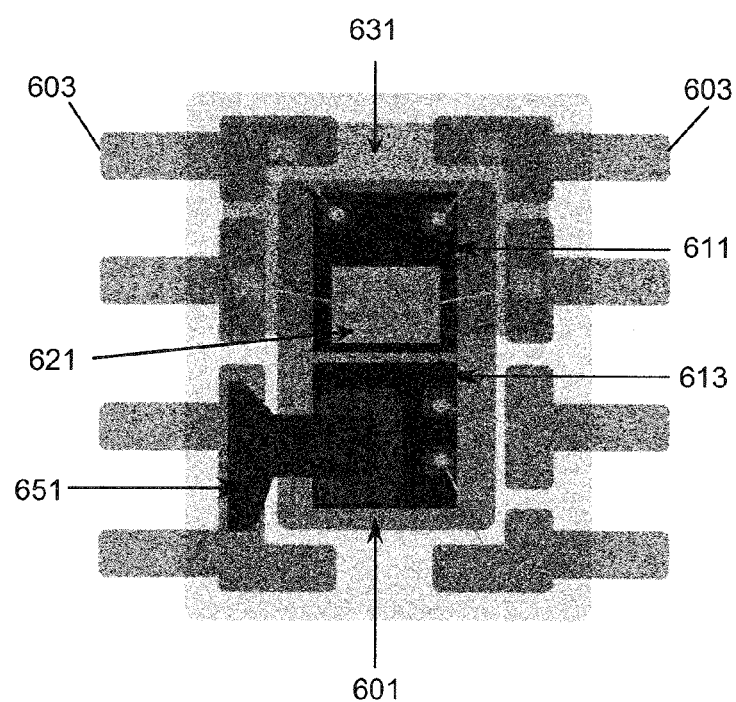
FIG. 7 shows a top view of a chip package of FIG. 6 according to an embodiment.

A top view of the chip package of FIG. 6 is shown in FIG. 7, which shows the first chip 611 and the second chip 613 attached on the die pad 601, the third chip 621 attached on the first chip 611, the clip 651 attached on the second chip 613, the fourth chip 631 bonded on top of the third chip 621, and the respective wire bonds connected from the respective chip to the respective lead fingers 603.

Figure 8:
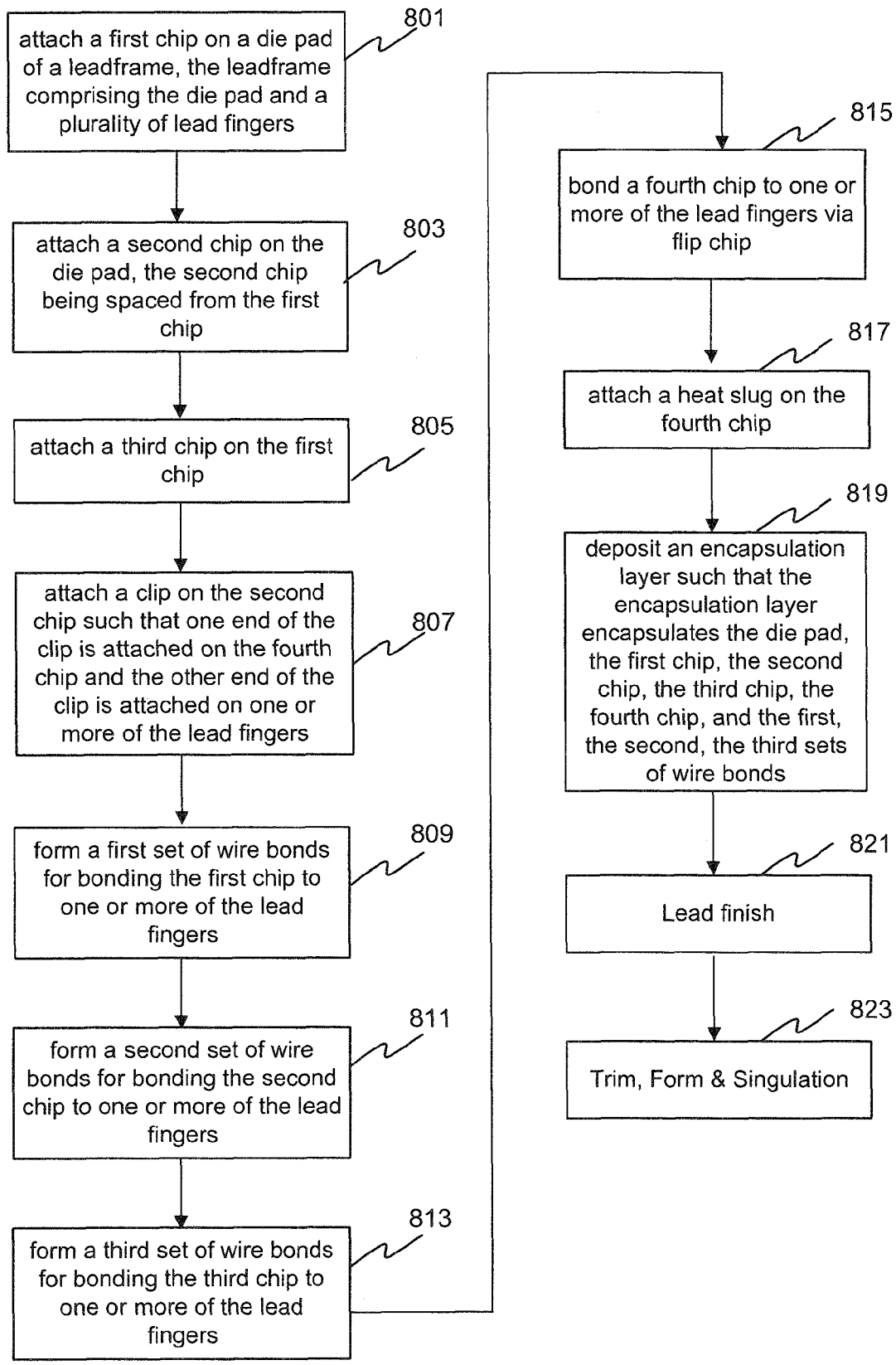
FIG. 8 shows a flowchart illustrating a method of forming a chip package according to a further embodiment.

FIG. 8 shows a flowchart illustrating a method of manufacturing a chip package (e.g. the chip package of FIG. 6 and FIG. 7) according to another embodiment.

At 801, a first chip is attached on a die pad of a leadframe, wherein the leadframe includes the die pad and a plurality of lead fingers.

At 803, a second chip is attached on the die pad, wherein the second chip may be spaced from the first chip.

In an embodiment, the first chip and the second chip may be attached on the die pad via die bonding using printable pastes, glue or die attach films. In another embodiment, the first chip and the second chip may be attached on the die pad using diffusion soldering. In an embodiment, the first chip and the second chip may be attached to the die pad using non-conductive die attach material, e.g. in a glue process, a die attach process or a wafer back coating process. In another embodiment, the first chip and the second chip may be attached to the die pad using conductive die attach material (such as solder paste, glue or epoxy) in a die attach process or a wafer back coating process. In a further embodiment, the first chip and the second chip may be attached to the die pad using solder wire in a soft solder process. Other suitable die attach materials and processes may also be used to attach the first chip and the second chip on the die pad in other embodiments. The attachment of the first chip and the second chip in 801, 803 may be performed simultaneously or sequentially.

At 805, a third chip is attached on the first chip. The third chip may be attached via die bonding using printable pastes, glue or die attach films, or may be attached using diffusion soldering, or using other suitable die attach materials and processes. In an embodiment, the third chip may be attached on the first chip using non-conductive die attach material, e.g. in a glue/epoxy process, a die attach process or a wafer back coating process. In another embodiment, the third chip may be attached to the first chip using conductive die attach material (such as solder paste, glue or epoxy) in a die attach process or a wafer back coating process.

At 807, a clip is attached on the second chip, e.g. using solder paste or other suitable adhesive. In an embodiment, the clip may be attached on the second chip using non-conductive die attach material, e.g. in a glue process, a die attach process or a wafer back coating process. In another embodiment, the clip may be attached to the second chip using conductive die attach material (such as solder paste, glue or epoxy) in a die attach process or a wafer back coating process. In a further embodiment, the clip may be attached to the second chip using solder wire in a soft solder process. In other embodiments, the clip may be attached using other suitable adhesive in other suitable process.

The clip may be arranged such that one end of the clip is attached on the second chip and the other end of the clip is attached on one or more lead fingers. The clip may have a hook shape or other suitable shapes to be fit between the second chip and the corresponding lead fingers of the leadframe.

At 809, a first set of wire bonds are formed for bonding the first chip to one or more of the lead fingers.

At 811, a second set of wire bonds are formed for bonding the second chip to one or more of the lead fingers.

At 813, a third set of wire bonds are formed for bonding the third chip to one or more of the lead fingers.

In an embodiment, the first set of wire bonds, the second set of wire bonds and the third set of wire bonds may be formed in a wire bonding process, e.g. using ball stitch on ball (BSOB) bonding. In another embodiment, forming the first set of wire bonds, the second set of wire bonds and the third set of wire bonds may include forming one or more security bonds on the lead fingers, such that the first chip, the second chip and the third chip may be wire bonded with the respective security bonds on the respective lead fingers via the first set of wire bonds, the second set of wire bonds and the third set of wire bonds, respectively. In other embodiments, the first set of wire bonds, the second set of wire bonds and the third set of wire bonds may be formed using other suitable wire bonding techniques, e.g. using solder bond, aluminum wire bond, gold wire bond, palladium coated gold wire bond, silver wire bond, or copper wire bond by thermosonic bonding or laser bonding.

The forming of the first set of wire bonds, the second set of wire bonds and the third set of wire bonds in the wire bonding process of 809, 811, 813 may be carried out simultaneously or sequentially.

At 815, a fourth chip is bonded to one or more of the lead fingers via a flip chip process. In an embodiment, an active surface of the fourth chip may face an active surface of the third chip. In various embodiments, the fourth chip may be bonded on the BSOB or security bonds on the lead fingers.

At 817, a heat slug is attached on the fourth chip. In various embodiments, the heat slug may be attached on the fourth chip using die attach films or diffusion solder.

At 819, an encapsulation layer may be deposited to encapsulate the die pad, the first chip, the second chip, the third chip, the fourth chip, the first set of wire bonds, the second set of wire bonds and the third set of wire bonds.

At 821, a lead finish may be carried out, e.g. using a coating process or a plating process.

At 823, a trim, form and singulation process may be carried out, so as to separate individual chip packages from the leadframe.

The various embodiments provide a single and compact chip package having multi-functionality in a miniature IC package. The multi-function chip package of various embodiments also provides higher electrical performance and good thermal cooling performance.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip package, comprising:
a leadframe comprising a die pad and a plurality of lead fingers; wherein the lead fingers extend out of the chip package;
at least a first chip comprising an active surface and a second surface opposite the active surface, the second surface of the first chip being attached to the die pad, the active surface of the at least first chip being bonded to a surface of one or more of the lead fingers via a first set of wire bonds, wherein the at least first chip includes a power MOS transistor;
a second chip bonded to one or more of the lead fingers;
a heat slug attached to the second chip; and
an encapsulation material encapsulating the die pad, the at least first chip, the second chip, and the first set of wire bonds;
wherein the die pad is exposed on a first surface of the chip package, configured to externally dissipate heat, and the heat slug is exposed on a second surface of the chip package opposite the first surface, configured to externally dissipate heat.

2. The chip package of claim 1,
wherein an active surface of the second chip faces the active surface of the at least first chip.

3. The chip package of claim 1, further comprising:
a third chip attached on the first chip, the third chip being bonded to one or more of the lead fingers via a second set of wire bonds.

4. The chip package of claim 3,
wherein an active surface of the third chip faces the active surface of the second chip.

5. The chip package of claim 1, further comprising:
a fourth chip attached on the die pad, the fourth chip being spaced from the first chip.

6. The chip package of claim 5,
wherein the fourth chip is bonded to one or more of the lead fingers via a third set of wire bonds.

7. The chip package of claim 5, further comprising:
a clip having one end attached on the fourth chip and having the other end attached on one or more of the lead fingers.

8. A chip package, comprising:
a chip carrier comprising a chip contact structure and a chip attach structure;
wherein the chip contact structure extends out of the chip package;
an active surface of at least a first chip being bonded to a surface of the chip contact structure via wire bonds, and a second surface of the at least first chip opposite the active surface being attached to the chip attach structure;
a second chip bonded to the chip contact structure;
wherein an active surface of the second chip faces the active surface of the at least first chip;
a heat dissipation structure attached to the second chip; and
an encapsulation material encapsulating the chip attach structure, the at least first chip, the second chip, and the wire bonds;
wherein the chip attach structure is exposed on a first surface of the chip package, configured to externally dissipate heat at the first surface, and the heat dissipation structure is exposed on a second surface of the chip package opposite the first surface, configured to externally dissipate heat at the second surface.

9. A chip package, comprising:
a chip carrier comprising a chip contact structure and a chip attach structure;
wherein the chip contact structure extends out of the chip package;
an active surface of at least a first chip being bonded to a surface of the chip contact structure via a first chip bonding technology structure, and a second surface of the at least first chip opposite the active surface being attached to the chip attach structure;
a second chip being bonded to the chip contact structure via a second chip bonding technology structure, wherein the second chip bonding technology structure is different from the first chip bonding technology structure;
wherein an active surface of the second chip faces the active surface of the at least first chip;

a heat dissipation structure attached to the second chip; and
an encapsulation material encapsulating the chip attach structure, the at least first chip, the second chip, and the wire bonds;
wherein the chip attach structure is exposed on a first surface of the chip package, configured to externally dissipate heat, and the heat dissipation structure is exposed on a second surface of the chip package opposite the first surface, configured to externally dissipate heat.

10. The chip package of claim 9, wherein
the first chip bonding technology structure comprises a plurality of bond wires; and
the second chip bonding technology structure comprises a flip chip structure.

11. The chip package of claim 1,
wherein a gap is disposed between the at least first chip and the second chip.

12. The chip package of claim 1, further comprising
a clip having a first end and a second end; wherein the first end is attached to the first chip, the second chip, or both; and wherein the second end is attached on one or more lead fingers.

13. The chip package of claim 12,
wherein the clip has a hook shape.

14. The chip package of claim 11,
wherein the first set of wire bonds are disposed in the gap.

15. The chip package of claim 11,
wherein the gap is filled with the encapsulation material.

16. The chip package of claim 1,
wherein the encapsulation material at least partially encapsulates a top surface and a bottom surface of the plurality of lead fingers, wherein the top surface is opposite the bottom surface.

17. The chip package of claim 8,
wherein a gap is disposed between the at least first chip and the second chip.

18. The chip package of claim 17,
wherein the wire bonds are disposed in the gap.

19. The chip package of claim 9,
wherein a gap is disposed between the at least first chip and the second chip.

20. The chip package of claim 19,
wherein the first chip bonding technology structure is disposed in the gap.

* * * * *